United States Patent [19]
> See

[11] 4,214,172
[45] Jul. 22, 1980

[54] INTERLOCK FOR POWER SOURCES IN DATA PROCESSING APPARATUS

[75] Inventor: Gary G. See, Chagrin Falls, Ohio

[73] Assignee: Telxon Corporation, Bath, Ohio

[21] Appl. No.: 12,399

[22] Filed: Feb. 15, 1979

[51] Int. Cl.² .......................... H02J 9/00; E05B 65/46
[52] U.S. Cl. ...................................... 307/150; 307/66; 361/339; 361/380; 312/215
[58] Field of Search .................. 307/149, 150, 43, 48, 307/66; 361/192, 193, 343, 339, 380, 1; 364/900, 200; 235/1 D; 312/215, 221, 271

[56] References Cited
U.S. PATENT DOCUMENTS 3,941,441  3/1976  Scheerhorn ........................ 312/215
4,074,118  2/1978  Washizuka ......................... 361/380

Primary Examiner—L. T. Hix
Assistant Examiner—S. D. Schreyer

[57] ABSTRACT

A mechanical interlock for a hand held data processing device which prevents removal of an alternate electric power source when a separate power source is disengaged from the device and the electronic circuitry powered by it.

The technical problem addressed by this invention is that of preventing adverse effect on electronic circuitry, such as loss of data stored in memory, due to removal of all electric power therefrom by assuring an uninterrupted source of electric power.

15 Claims, 6 Drawing Figures

INTERLOCK FOR POWER SOURCES IN DATA PROCESSING APPARATUS

BACKGROUND AND FIELD OF THE INVENTION

Hand held electronic data processing devices for receipt, storage and processing of information are used increasingly in connection, for example, with inventory control in retail outlets. Such devices often include electronic apparatus which maybe adversely affected by loss of power. Certain solid state memories, for example, are "volatile" in the sense that data stored therein will be lost if power is removed from the memory. Devices using these memories therefore require an uninterrupted source of electrical power to preserve the information stored therein.

Power for such devices is usually provided by a battery pack which includes one or more dry d.c. cells of the rechargeable, or nonrechargeable type. In either case, replacement of the cells is eventually necessary. Should the need for replacement of the battery or batteries occur, for example, during an inventory, removal of the battery pack for as much as a few seconds could result in the loss of all the data stored in the memory and the loss of the hours or days of time required to collect and store the information in the processor. The battery pack is often carried in a removable container, or retained in the housing by a removable member, e.g., a top or cover plate.

In order to prevent loss of stored information during battery replacement, some prior devices have included electronic means such as a charged condenser to maintain power on the memory. Due to the limited power storage capacity of the condensor, however, this may add as little as a few seconds of data retention after removal of the batteries, or other power source. If one battery is inadvertently put into a pack of several batteries backwards, for example, the time remaining to discover and correct the problem may exceed that available, particularly if power dissipation is high, due to the inclusion of a substantial amount of solid state memory.

One method of alleviating this problem has been to provide a secondary source of power in parallel with the primary source of power. The secondary source is engaged temporarily while replacement of the primary batteries is effected. This is effective unless the secondary battery is itself discharged or inadvertently removed at the same time the primary source of power is removed. In either case, the stored information may be lost.

BRIEF STATEMENT OF THE INVENTION

The present invention provides an interlock structure which coacts between separate selectively removable power sources to prevent removal of both sources at the same time. Thus, if a primary battery pack is removed for replacement of one or more cells, a secondary power source is locked in place against removal. In other embodiments of the invention, the interlock alternates so that if either of the power sources is removed, the remaining power source is locked in place against removal. In this way, power is applied continuously to those portions of the electrical circuit where necessary to prevent loss of data stored in memory.

Briefly stated, then, the present invention relates to apparatus, such as a hand held electronic data processing device, which includes electronic circuitry adversely affected by loss of electric power. Plural separate, removable sources of power are connected to the electrical circuit. A holder for each power source is provided. A mechanical interlock is provided which coacts between the holders of such sources whereby when one of such electric power sources is removed, removal of the other is prevented.

In more specific embodiments of the invention, the electric power sources each include one or more cells in a battery pack carried in a removable cartridge, or in a chamber. Removal of the first electric power source actuates a lever system which engages and locks in a second electric power source and prevents its removal from the device. Reinsertion of the first electric power source activates the lever system to disengage the lock from the other container and enables selective removal of the second electric power source. In still other embodiments, means are provided which are actuated on removal of the second electric power source to prevent removal of the first electric power source.

BRIEF DESCRIPTION OF THE DRAWINGS

The present invention may be better understood by having reference to the annexed drawings showing a preferred embodiment of the invention and wherein.

DETAILED DESCRIPTION OF THE DRAWINGS

The hand held electronic data processing devices with which this invention is particularly useful include conventional electronic components which require a power source, usually direct current or rectified a.c. They also include one or more electronic components, e.g., a microprocessor "chip" and associated memory, capable of storing data and selectively displaying or transmitting such data for visual display or print out, for example. This memory generally provides volatile data storage. Such memory devices will lose all data stored therein if the power source is disconnected from the electrical circuit. The circuitry in such devices and the actuating means therefor form no part of the present invention and are otherwise conventional. The invention is concerned with a mechanical interlock to prevent inadvertent loss of data stored in memory by assuring that power is continually supplied to the electrical circuit. The invention concerns particularly devices that are characterized by plural separate power sources.

Figure 1:
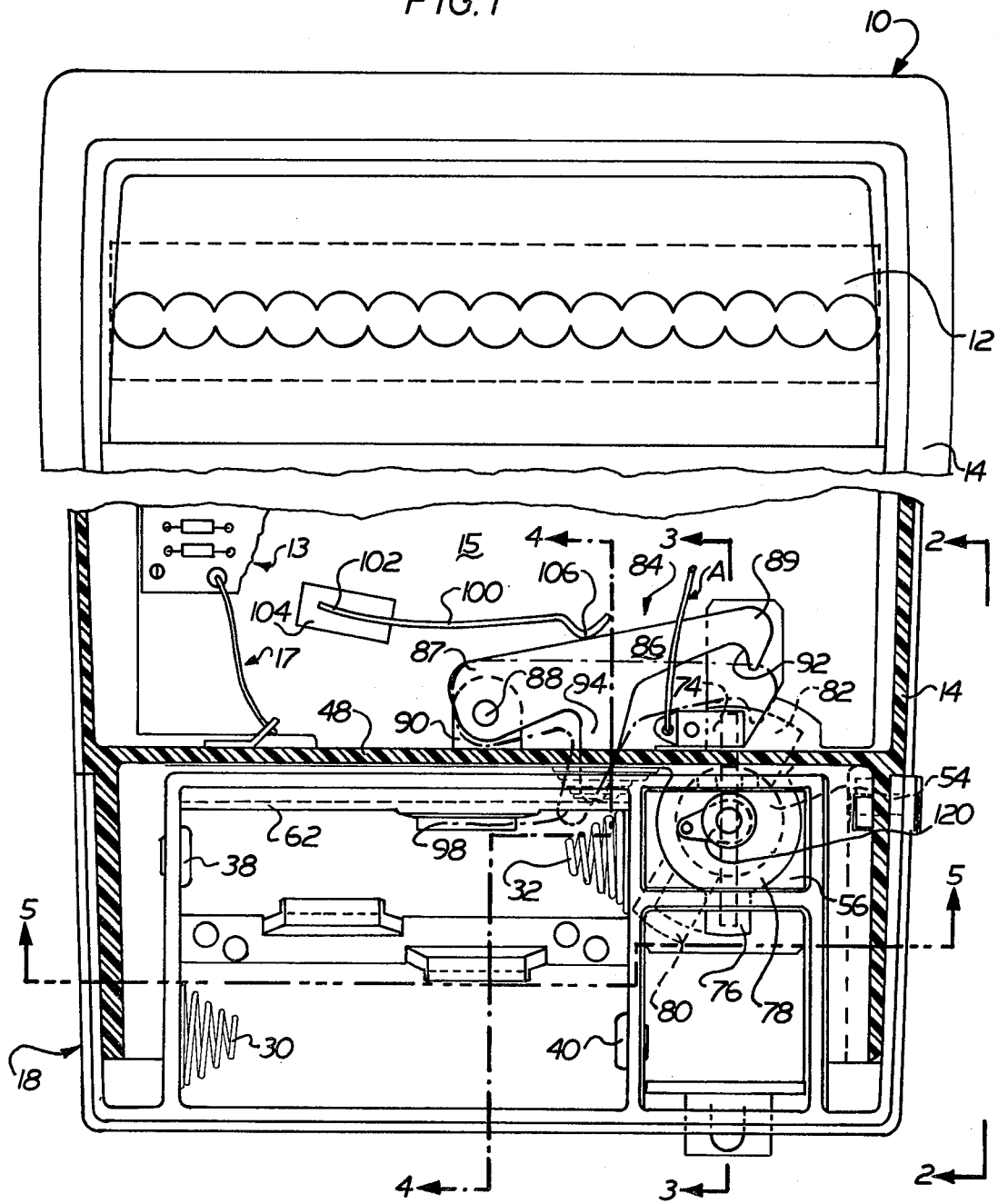
FIG. 1 is a fragmentary, partially cut away plan and cross-sectional view of a hand held eletronic data processing and display device for the receipt, storage and processing of data in accordance with this invention.
Figure 2:
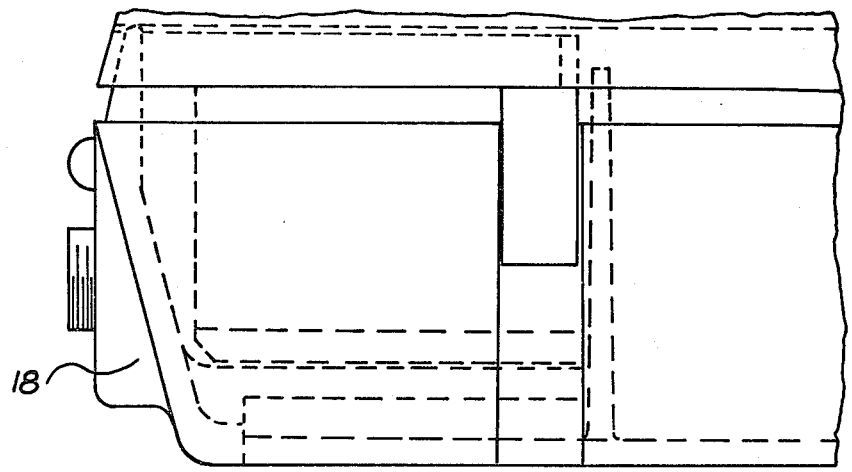
FIG. 2 is a fragmentary side elevation of one end of the device shown in FIG. 1.

Referring then to FIGS. 1-4 there is shown in FIG. 1 in fragmentary from a digital display device 10 having a digital display window 12 in which alphanumeric data or information appears as from a plurality of light emitting diodes. Keys (not shown) are provided for inserting data related signals into the circuitry for storage in a random access memory (RAM) as indicated above. A housing 14 of a conventional molded plastic is provided for enclosing the electronic components, display and power sources, and for supporting data or information keys (not shown).

Figure 3:
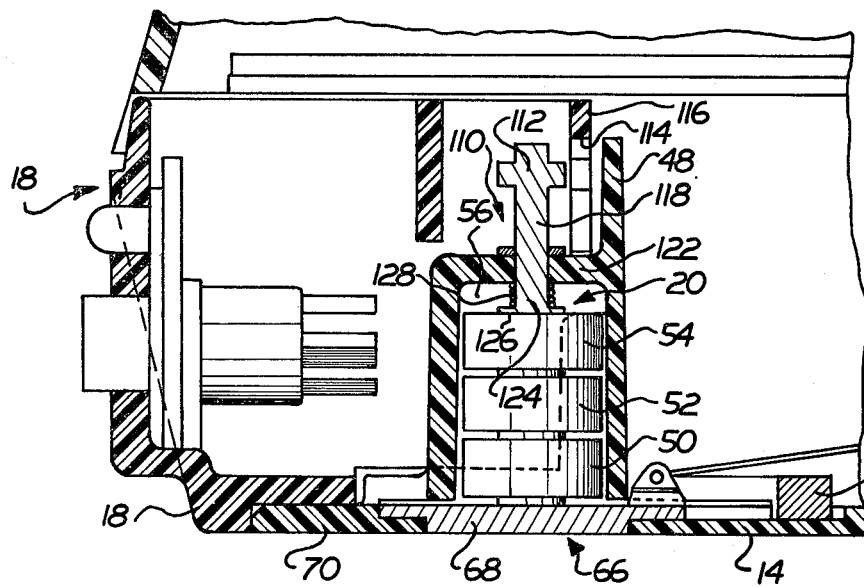
FIG. 3 is a fragmentary cross-sectional view of the device shown in FIG. 1 as it appears in the plane indicated by the line 3—3 in FIG. 1.
Figure 4:
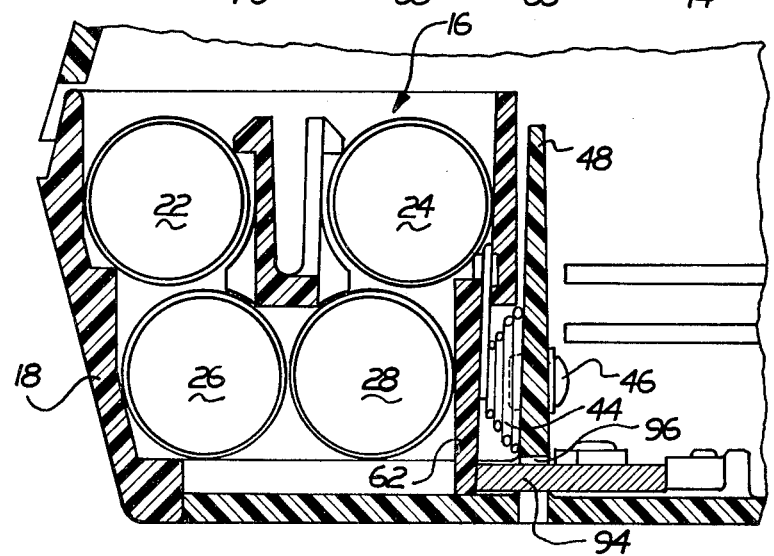
FIG. 4 is a fragmentary cross-sectional view of the device shown in FIG. 1 as it appears in the broken plane indicated by the line 4—4 in FIG. 1.

As indicated, the present invention is concerned with the power sources, usually in the form of battery packs. In the present invention the plural power sources include a first battery pack, generally indicated at 16 in FIG. 4 and adapted to be disposed in a removable drawer or sub-housing 18, as shown in in FIg. 1. A second electric power source includes a second battery pack 20 as shown in FIG. 3. The first electric power source 16 in the embodiment shown in the drawings is composed of four dry cells 22, 24, 26 and 28 (FIG. 4) connected in series in a known manner. Suitable metal springs, such as springs 30, 32, 34 and 36 and metallic button contacts, such as contacts 38, 40 and 42 (FIGS. 1 and 5) are suitably mounted in the drawer 18. Suitable conductors are carried by the drawer 18 for carrying power from the cells to a metallic spring conductor, such as spring conductor 44 (FIG. 4). The drawer 18 holds the first electric power source in the housing 14, and is removable as a unit with the cells from the housing.

Spring conductor 44 is connected to a through-the-wall button contact 46 for transmitting power from the first power source 16 to a printed circuit board 13 carried in the housing 14. The printed circuit board 13 (fragmentary shown) includes or is electrically connected to a portion of the circuit which is adversely affected by removal of power, e.g., a RAM device. Contact 46 is mounted in an integrally cast divider wall 48. The structure for transmitting power from the first electric power source 16 for availability to the circuit board 13 may be any convenient structure such as that shown at 17, or a flexible disconnectable cable, pin connectors, or any other suitable means well known to those skilled in the art. Power may also be supplied from an external rectified a.c. source or an external d.c. battery source through a plug connector to the unit.

The second electric power source 20 in the embodiment shown in the drawings is composed of three watch cells 50, 52 and 54, best shown in FIG. 3, connected in series in a known manner. The second electric power source 20 is held in a chamber 56 formed in the housing 14. The chamber 56 includes a removable cap or cover 66 to hold or retain the second electric power source. A suitable conductor 58 is provided communicating with a spiral conductor spring 60 for transmitting power from the second power source to the printed circuit board 13. Again, the structure for transmitting electric power from the second power source 20 for availability to the circuit board 13 may be any convenient structure such as that shown at 19, or a flexible, disconnectable cable, pin connectors, or any other known means.

The spring contacts or current collectors 44 and 60 do, however, coact between the integrally cast divider wall 48 and the back wall 62 of the drawer 18 to bias the drawer 18 outwardly and to provide a firm electrical contact with a suitably placed conductor on the wall 62.

The drawer 18 is held into the fully inserted position against the spring bias of springs 44 and 60 by a latch 64.

Figure 6:
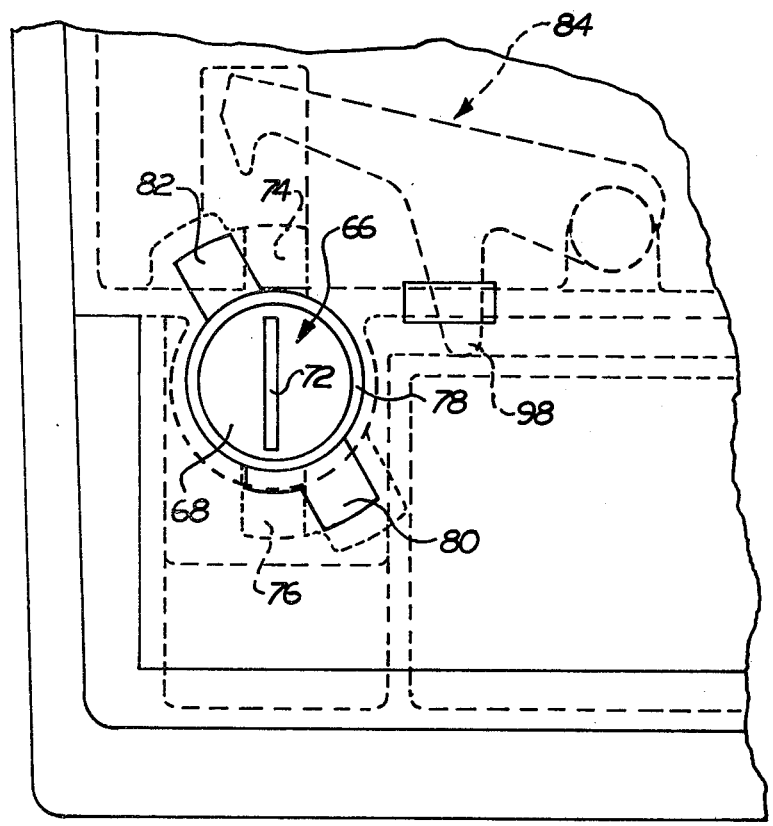
FIG. 6 is a fragmentary bottom view of the device shown in FIG. 1 showing a structure for containing and enabling removal of a second d.c. power source with the primary source in place.

The second electric power source 20 may be contained in a second separately removable drawer, if desired. However, in the preferred embodiment shown in the drawings, the second power source is contained in the chamber 56 which is closed with a selectively removable metallic cover 66 (FIG. 6). The cover 66 is provided with a circular portion 68 for location flush with the bottom wall 70 (FIG. 3) of the housing 14. The cover 66 also includes a locking means operable by twisting or rotating the cover 66 with the aid of a coin engaged in coin slot 72. The locking means includes a pair of diametrically opposed projecting lugs 74 and 76 extending from a flange 78 on the inner side of the circular portion 68. When the lugs 74 and 76 are rotated (counter clockwise as shown in FIG. 6) into registry with windows 80 and 82, the cover 66 may be removed enabling removal of the cells 50, 52 and 54. Otherwise, the lugs 74 and 76 remain locked against accidental removal behind overlying adjacent housing portions 75 and 77 (FIG. 6).

One form of interlock in accordance with the present invention is shown best in FIGS. 1 and 6. This form is adapted to coact between the drawer 18 and the cover 66 in such a way that when the drawer 18 is removed from the housing 14 for replacement of the cells 22, 24, 26 and 28, the cover 66 cannot be removed. However, when the drawer 18 is in place in the housing 14, This interlock is disabled or released and the second electric power source 20 may be removed for replacement of the cells 50, 52 and 54 if necessary.

The interlock is generally indicated by the number 84 in FIGS. 1 and 6. Interlock 84 includes a lever 86 mounted at its proximal end 87 for pivotal movement about a pin 88 fixedly carried in a boss 90 molded into the bottom of the housing 14. The distal end 89 is provided with a hook 92 which is located for locking engagement with the lug 74 as indicated in phantom in FIG. 1. As shown in solid lines in FIG. 1, the hook 92 is out of engagement with the lug 74 and the cover 66 may be removed as described above.

The lever 86 is provided with an integral arm 94 which is adapted to cooperate with the rear wall portion 62 of the drawer 18. A suitable aperture 96 is provided through integrally cast wall 48 to enable the arm 94 to sense the presence or absence of the drawer 18. When the drawer 18 is moved into the housing 14, the rear wall 62 of the drawer 18 abuts against the free end 98 of the arm 94 and causes the lever 86 to pivot about the pin 88 in a counterclockwise direction as shown in FIG. 1 to the disengaged position shown in FIG. 1 in solid lines. In so doing, the lever 86 moves aginst the bias of a leaf spring 100 supported at one end 102 in a spring mounting block 104 secured to or integral with the bottom 15 of the housing 14, and bearing at its free end 106 against the lever arm 86.

As the drawer 18 is withdrawn from the housing 10, the spring 100 urges the lever 86 in a clockwise direction about the pin 88 to position the hook 92 into locking engagement with the lug 74. This prevents rotation of the cover 66 in a manner to bring the lugs 74 and 76 into registry with the cut outs or windows 82 and 80, respectively, and thus the power source 20 remains connected in the electrical circuit and loss of data stored due to power loss is prevented.

To provide a further or second interlock or "fail safe" device, there may optionally be provided a second interlock coacting between the first and second power sources. A circumstance not protected against with the interlock first described above occurs when the second power source is removed first, and thereafter the primary or first power source is removed. In most instances, the second power source is a standby source connected into the circuit only when the primary power source is in need of replacement of one or more cells. Replacement of the secondary power source cells is unlikely to occur as often as the primary power source cells. To prevent loss of data in the event it is necessary or desired to replace cells in both the primary and secondary electric power sources, a second interlock may be provided.

Figure 5:
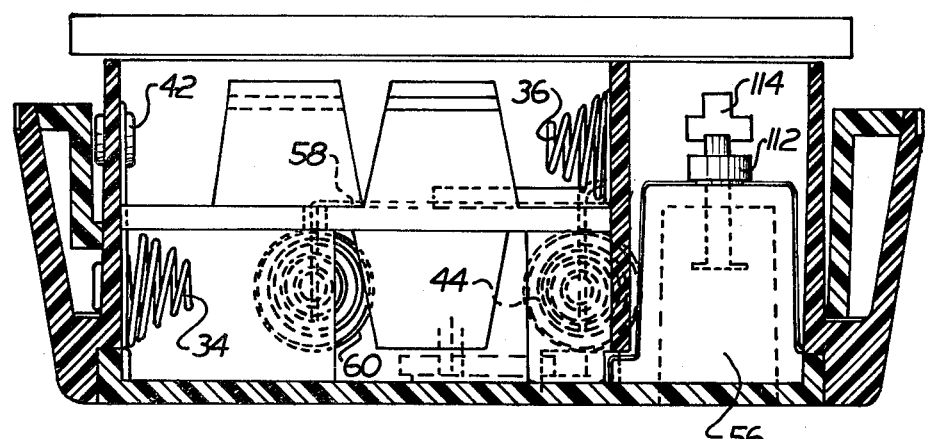
FIG. 5 is a transverse cross-sectional view of the device shown in FIG. 1 as it appears in the plane indicated by the line 5—5 in FIG. 1.

With reference to FIGS. 3 and 5 there is shown one form of second or auxiliary interlock useful in accordance with this invention. The interlock 110 includes a key 112 of circular cross-section configured for passage through a keyway 114 in the rear wall portion 116 of the drawer 18 (FIG. 3). The key 110 includes a stem portion 118 which extends through the conductor lug 120 and the top wall 122 of the chamber 56. The inner end 124 of the stem 118 is disposed within the chamber 56 and is provided with a suitable spring seat such as flange 126 which may be threadedly secured to the inner end 124. Coacting between the underside of the top wall 122 and the flange 126 is a coil spring 128 for biasing the flange away from the top wall 122.

The keyway 114 in the rear wall 116 of the drawer 18 will admit the key 112 when the cells 50, 52 and 54 are in place in the chamber 56 and the key 112 is in registry with the keyway 114. When the cells 50, 52 and 54 are removed, the bias of the spring 128 against the flange 126 displaces the key 112 to a position out of registry with the keyway 114 and thereby prevents removal of the drawer 18 and the power pack contained therein. Although this second interlock can be defeated by manually operating the key 112, the chances of inadvertent removal of both power sources at the same time are minimized.

Accordingly, there has been provided a mechanical interlock for a hand held data processing device which prevents removal of an alternate electric power source when a separate power source is disengaged from the device and the electronic circuitry powered by it. Thus, the alternate electric power source takes over temporarily during replacement of or disconnection of the separate electric power source to preserve data in memory that would otherwise be lost along with the possible man-hours of time required to insert such data in the processor. Also, there has been provided an optional interlock which prevents removal of the separate power source when the alternate power source is removed or disconnected from the circuit.

What is claimed is:

1. Apparatus including electrical circuitry adversely affected by removal of electric power therefrom, a housing, separate first and second electric power sources each adapted to be engaged in said housing and selectively disengageable therefrom, means for coupling electric power from said first and second electric power sources to said electrical circuitry, selectively removable means for holding said first and second electric power sources, respectively, engaged in said housing and means in said housing coacting between said respective first and second electric power source holding means for lockingly engaging one of said respective first and second electric power source holding means to restrain removal thereof when the other of said respective first and second electric power sources is removed from the housing.

2. Apparatus as defined in claim 1 wherein said first electric power source is disposed in a sub-housing which sub-housing is selectively positionable in said housing and removable from said housing.

3. Apparatus as defined in claim 1 or 2 wherein said first electric power source comprises a plurality of series connected cells.

4. Apparatus as defined in claim 1 or 2 wherein said second electric power source comprises a plurality of series connected cells.

5. Apparatus as defined in claim 1 or 2 wherein said second electric power source is removably contained in a separate chamber in said housing, said chamber having a removable cover to permit removal of said second electric power source.

6. Apparatus as defined in claim 5 wherein said locking means coacts with said removable cover to lock said removable cover against removal when said first power source is removed from the housing.

7. Apparatus as defined in claim 2 wherein said locking means coacts with said sub-housing and is actuated in response to removal of said sub-housing to prevent removal of said second electric power source.

8. Apparatus as defined in claim 7 wherein said locking means coacts with said sub-housing to disengage from locking relation with respect to said second electric power source holding means when said sub-housing is disposed in said housing.

9. Apparatus as defined in claim 1 or 2 wherein said locking means includes a lever pivotally mounted in said housing for movement into and out of engagement with said second electric power source holding means.

10. Apparatus as defined in claim 2 wherein said locking means includes a lever pivotally mounted at one end on a pin projecting from the inside of said housing, said lever having a hook at the other end for coaction with said second electric power source, and means coacting between said lever and said sub-housing for actuating said lever between a released position with respect to said second power source holding means when said first power source is held in said housing, and a locked position with respect to said second electric power source when said first electric power source is removed from said housing.

11. Apparatus as defined in claim 10 wherein said locking means includes means for biasing said lever whereby said lever actuating means is biased into engagement with said sub-housing when the sub-housing is disposed in the housing, and biased into locking engagement with said second power source when said sub-housing is removed from said housing.

12. Apparatus as defined in claim 11 wherein said biasing means is a leaf spring having one end secured to the housing, and the other end in engagement with said lever.

13. Apparatus as defined in claim 1 wherein said housing includes second means for lockingly coacting between said second and first power sources for lockingly engaging one of said second and first power sources to restrain removal thereof when the other of said second and first power sources is removed from the housing.

14. A hand held electronic data processing device including electrical circuitry adversely affected by removal of electric power therefrom, a housing, separate first and second electric power sources each adapted to be connected in said housing and selectively removable therefrom, means for coupling electric power from said first and second electric power sources, respectively, to said electrical circuitry, selectively removable means for holding said first and second electric power sources, respectively, in said housing, and means carried in said housing and coacting between said respective first and second electric power source holding means for lockingly engaging said second power source holding means to restrain removal of said second electric power source from the housing when the first electric power source is removed from said housing.

15. A hand held electronic data processing device including electrical circuitry adversely affected by removal of electric power therefrom, a housing, separate first and second electric power sources each adapted to be connected in said housing and selectively removable therefrom, means for coupling electric power from said first and second electric power sources, respectively, to said electrical circuitry, selectively removable means for holding said first and second electric power sources in said housing, and means carried in said housing and coacting between said respective second and first electric power source holding means for lockingly engaging said first power source holding means to restrain removal of said first electric power source from the housing when the second electric power source is removed from said housing.

* * * * *